(12) United States Patent
Ahn et al.

(10) Patent No.: US 9,764,949 B2
(45) Date of Patent: Sep. 19, 2017

(54) ANODIC OXIDE FILM STRUCTURE CUTTING METHOD AND UNIT ANODIC OXIDE FILM STRUCTURE

(71) Applicant: Point Engineering Co., Ltd., Asan-si (KR)

(72) Inventors: Bum Mo Ahn, Suwon-si (KR); Seung Ho Park, Hwaseong-si (KR); Sung Hyun Byun, Hwaseong (KR)

(73) Assignee: Point Engineering Co., Ltd., Asan-si, Chungcheongnam-do (KR)

( * ) Notice: Subject to any disclaimer, the term of this patent is extended or adjusted under 35 U.S.C. 154(b) by 0 days.

(21) Appl. No.: 15/259,478

(22) Filed: Sep. 8, 2016

(65) Prior Publication Data

US 2017/0081184 A1 Mar. 23, 2017

(30) Foreign Application Priority Data

Sep. 21, 2015 (KR) .................. 10-2015-0133153

(51) Int. Cl.
*B81C 1/00* (2006.01)
*H01L 21/786* (2006.01)
*H01L 21/78* (2006.01)

(52) U.S. Cl.
CPC ...... *B81C 1/00825* (2013.01); *B81C 1/00888* (2013.01); *B81C 2201/0114* (2013.01); *H01L 21/78* (2013.01)

(58) Field of Classification Search
CPC .................. H01L 21/78; H01L 21/786; H01L 21/84–21/86; B81C 2201/0114
See application file for complete search history.

(56) References Cited

U.S. PATENT DOCUMENTS

| | | | |
|---|---|---|---|
| 6,300,224 B1 * | 10/2001 | Arima | H01L 21/78 257/48 |
| 2010/0273312 A1 | 10/2010 | Noda | 438/462 |
| 2011/0036720 A1 * | 2/2011 | Tagawa | C25D 11/024 205/50 |

FOREIGN PATENT DOCUMENTS

| | | | |
|---|---|---|---|
| EP | 1 884 578 A1 | 2/2008 | C25D 11/10 |
| KR | 10-2006-0006283 | 1/2006 | C25D 11/06 |
| KR | 10-0660310 | 12/2006 | H01L 21/78 |
| KR | 10-2011-0008056 | 1/2011 | C25D 11/04 |

OTHER PUBLICATIONS

Korean Intellectual Property Office, Office Action—Korean Application No. 10-2015-0133153, dated Sep. 19, 2015, 5 pages.

(Continued)

*Primary Examiner* — Daniel Shook
(74) *Attorney, Agent, or Firm* — Sunstein Kann Murphy & Timbers LLP (57) ABSTRACT

An anodic oxide film structure cutting method is provided. The method includes: an etching step of forming an etched groove by etching one surface of an anodic oxide film having a plurality of anodizing pores along a predetermined cutting line and forming increased-diameter pores by enlarging entrances of the anodizing pores positioned on an inner bottom surface of the etched groove; and a cutting step of cutting the anodic oxide film along the etched groove. Also provided is a unit anodic oxide film structure produced by the cutting method.

1 Claim, 7 Drawing Sheets

(56) References Cited

OTHER PUBLICATIONS

Korean Intellectual Property Office, Office Action—Korean Application No. 10-2015-0133153, dated Sep. 21, 2015, 6 pages (English translation).
European Patent Office, Extended European Search Report—Application No. 16186997.9-1504, dated Dec. 14, 2016, 6 pages.

* cited by examiner

ANODIC OXIDE FILM STRUCTURE CUTTING METHOD AND UNIT ANODIC OXIDE FILM STRUCTURE

CROSS-REFERENCE TO RELATED PATENT APPLICATION

This U.S. non-provisional patent application claims priority under 35 U.S.C. §119 of Korean Patent Application No. 10-2015-0133153 filed on Sep. 21, 2015 in the Korean Patent Office, the entire contents of which are hereby incorporated by reference.

BACKGROUND

1. Technical Field

The present invention relates to an anodic oxide film structure cutting method and a unit anodic oxide film structure.

2. Description of Related Art

In general, unit bodies are simultaneously formed in a rectangular matrix shape. For the purpose of utilization thereof, the unit bodies are diced and individually separated by a cutting device. A dicing device used in a semiconductor manufacturing process performs a dicing work by fixing a wafer or a semiconductor strip to a jig formed in advance and then rotating a dicing blade at a high speed while injecting cooling water.

However, if the dicing device is directly applied to a structure of a micro level, a problem is posed in that, due to the pressure of the cooling water for dissipating the heat generated in a dicing process and the pressure of an air existing around the dicing blade rotating at a high speed, it is difficult to efficiently dice the wafer or the semiconductor strip into unit bodies Korean Patent Application Publication No. 2006-0006283 discloses a method of manufacturing an aluminum member or an aluminum alloy member of a semiconductor or display manufacturing device on which an anodic oxide film is coated. In the technique disclosed in the above publication, an aluminum alloy member is cut into a predetermined size in advance and the surface thereof is subjected to an anodizing process. Thus, the technique is not suitable for a process of using an anodic oxide layer as a substrate, forming electrodes on the upper surface of the substrate and then dicing the substrate into unit bodies.

If a metallic base material is subjected to an anodizing process, it is possible to form an anodic oxide film which includes a porous layer having a plurality of pores formed on the surface thereof and a barrier layer existing under the porous layer. There is available a structure in which electrodes are formed on a surface of an anodic oxide film as a substrate. However, a method of dicing this structure into unit bodies is not known. It is therefore difficult to efficiently dice the structure into unit bodies.

SUMMARY

In view of the problems mentioned above, it is an object of the present invention to provide an anodic oxide film structure cutting method which is less likely to generate cracks when cutting an anodic oxide film structure and which is superior in yield rate, and a unit anodic oxide film structure.

In order to achieve the above object, there is provided an anodic oxide film structure cutting method, including: an etching step of forming an etched groove by etching one surface of an anodic oxide film having a plurality of anodizing pores along a predetermined cutting line and forming increased-diameter pores by enlarging entrances of the anodizing pores positioned on an inner bottom surface of the etched groove; and a cutting step of cutting the anodic oxide film along the etched groove.

At least some of the increased-diameter pores may be connected to each other to form a space.

At the cutting step, the anodic oxide film may be cut by a dicing blade.

At the cutting step, the anodic oxide film may be broken by pressing the other surface of the anodic oxide film.

There is also provided a unit anodic oxide film structure having a plurality of anodizing pores, including: a body portion; and a step portion having a step difference with respect to an upper surface of the body portion and extending outward from the body portion, wherein the diameter of entrances of the anodizing pores formed on an upper surface of the step portion is larger than the diameter of entrances of the anodizing pores formed on the upper surface of the body portion.

At least some of the entrances of the anodizing pores formed on the upper surface of the step portion may be connected to each other to form a space.

Electrodes may be formed on the upper surface of the body portion.

The electrodes may be heater electrodes, sensor electrodes or both the heater electrodes and the sensor electrodes.

According to the present invention, the following effects may be achieved. It is possible to cut the anodic oxide film structure in such a way that the anodic oxide film receives a reduced tensile force. Thus, the cutting method of the present invention is less likely to generate cracks and is superior in yield rate. Accordingly, the anodic oxide film structure can be effectively utilized even when there is required a dicing process. In addition, the unit anodic oxide film structure is superior in structural stability.

DETAILED DESCRIPTION

Preferred embodiments of the present invention will now be described in detail with reference to the accompanying drawings. The advantages, features and methods for achieving the same will become apparent from the following description of preferred embodiments given in conjunction with the accompanying drawings. However, the present invention is not limited to the embodiments described herein but may be embodied in many different forms. Rather, the embodiments disclosed herein are provided in order to ensure that the disclosure becomes thorough and perfect and to ensure that the concept of the present invention is sufficiently delivered to a person having an ordinary knowledge in the relevant art. The present invention is defined only by the claims. Throughout the specification, the same reference symbols designate like components.

The terms used herein are presented for the description of the embodiments but are not intended to limit the present invention. In the subject specification, a singular form includes a plural form unless specifically mentioned otherwise. By the term "comprises" or "comprising" used herein, it is meant that a component, a step, an operation or an element referred to herein does not exclude existence or addition of one or more other components, steps, operations or elements. Furthermore, the reference symbols presented in the order of descriptions is not necessarily limited to the specified order.

The embodiments disclosed herein will be described with reference to sectional views and/or plane views which are ideal exemplary views illustrating the present invention. In the drawings, the thickness of a film and a region is exaggerated to effectively describe the technical contents. Thus, the form of exemplary views may be changed depending on a manufacturing technique and/or a tolerance. For that reason, the embodiments of the present invention are not limited to specific formed illustrated in the drawings but may include changes in form generated depending on a manufacturing process. Accordingly, the regions illustrated in the drawings have general attributes. The shapes of the regions illustrated in the drawings merely illustrate specific forms of element regions and do not limit the scope of the invention.

Preferred embodiments of the present invention will now be described in detail with reference to the accompanying drawings. For reference, the configurations identical with those of the related art among the configurations of the present invention to be described later will not be further described in detail. Reference is made to the related art described above.

Figure 2:
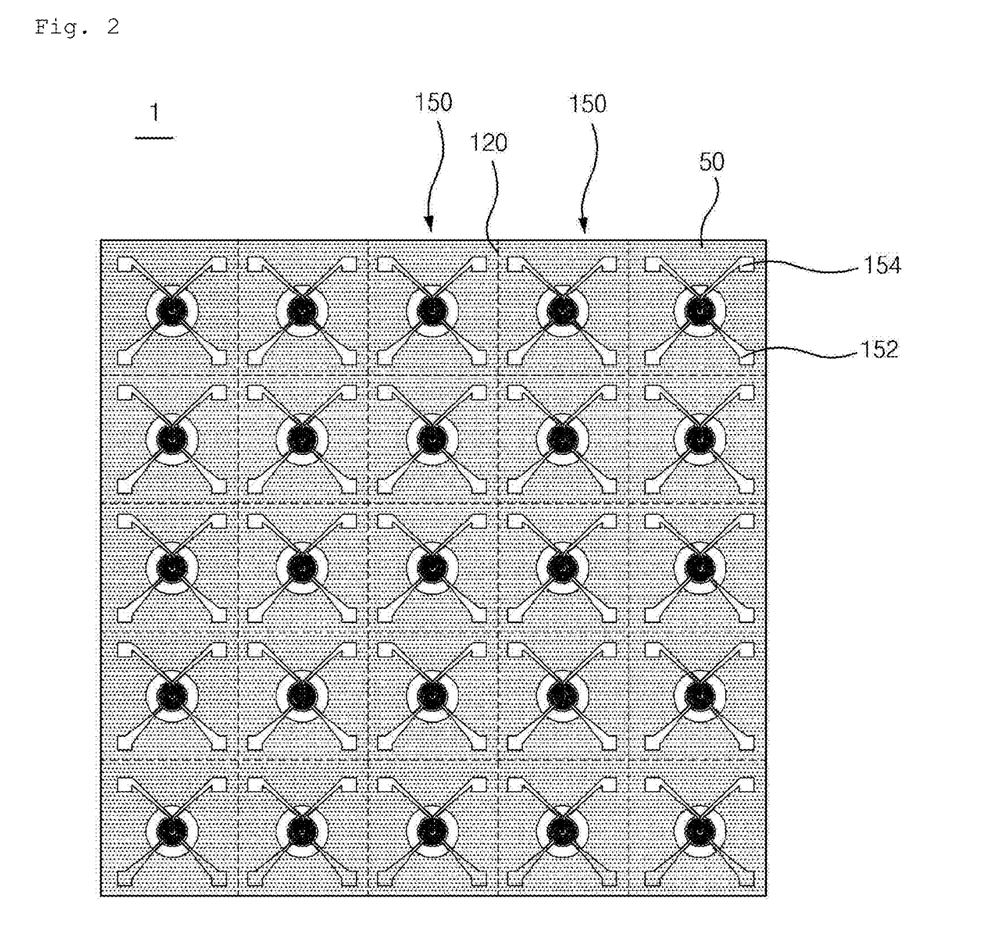
FIG. 2 is a plane view illustrating a state in which electrodes are formed on an upper surface of an anodic oxide film structure.

The anodic oxide film structure 1 of the present invention includes an anodic oxide film 50 serving as a substrate. Various kinds of electrodes or chips are disposed on the anodic oxide film 50 at predetermined intervals. In the anodic oxide film structure 1, as illustrated in FIG. 2, unit anodic oxide film structures 150, which are unit bodies, are collectively formed in a rectangular matrix shape. Each of the unit anodic oxide film structures 150 includes a rectangular parallelepiped anodic oxide film 50 having a rectangular upper surface, and electrodes formed on the upper surface of the anodic oxide film 50 as a substrate. The electrodes include heater electrodes 151 and sensor electrodes 154. Examples of individual components manufactured by dicing the anodic oxide film structure 1 include various kinds of sensors. In the following descriptions, micro sensors 150 will be taken as an example.

Figure 1:
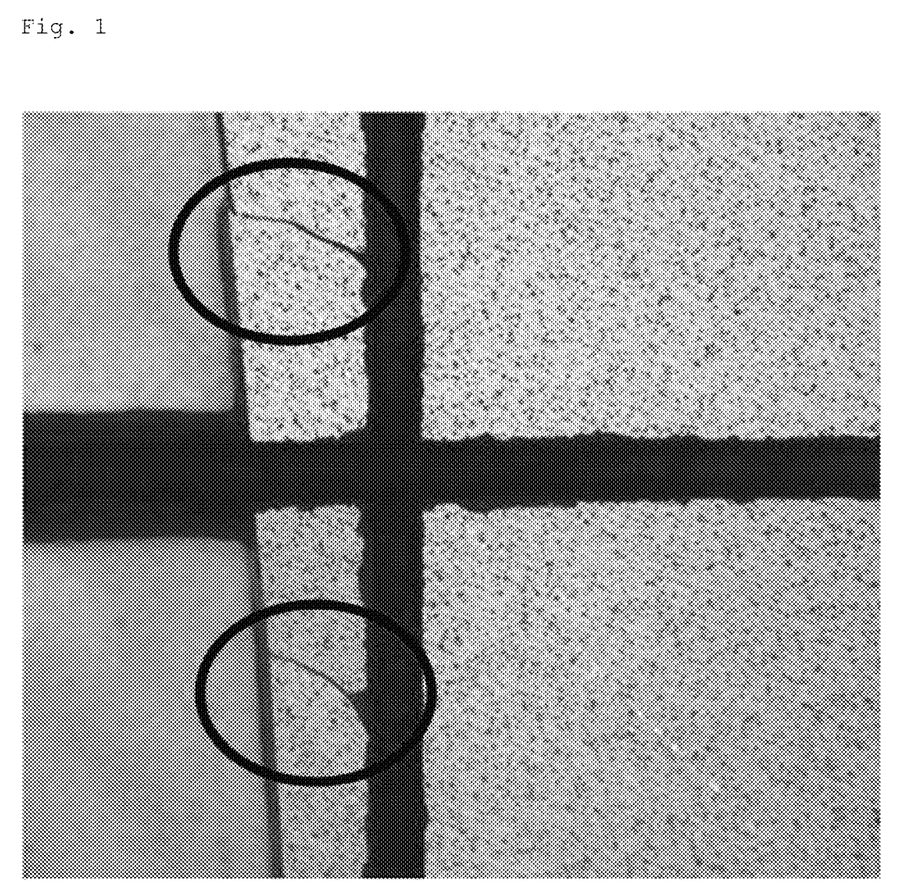
FIG. 1 is a photograph illustrating a state in which cracks are generated in an anodic oxide film structure during a cutting process thereof.

The present inventor has found that, if the anodic oxide film structure 1 is cut by a dicing method well-known in the art, cracks are likely to generate as illustrated in FIG. 1, which poses a problem of reduced yield rate. The reason for the cracks being generated appears to be that the dicing method of the related art is not suitable for cutting the anodic oxide film structure 1.

The cutting method of the present embodiment is a method by which the anodic oxide film structure 1 formed of a plurality of unit anodic oxide film structures 150 as illustrated in FIG. 2 is diced into individual unit anodic oxide film structures 150. The anodic oxide film structure 1 is cut along predetermined cutting lines 120 indicated by broken lines in FIG. 2 and is divided into a plurality of unit anodic oxide film structures 150.

In FIGS. 2 to 7, the diameter and depth of anodizing pores 110 are exaggerated for the sake of convenience in description. The technical spirit of the present invention is not limited to the structure illustrated in FIGS. 2 to 7.

The anodic oxide film structure cutting method according to a preferred embodiment of the present invention includes: an etching step (S1) of forming an etched groove 300 by etching one surface of an anodic oxide film 50 having a plurality of anodizing pores 110 along a predetermined cutting line 120 and forming increased-diameter pores 210 by enlarging entrances 213 of the anodizing pores 110 positioned on an inner bottom surface of the etched groove 300; and a cutting step (S2) of cutting the anodic oxide film 50 along the etched groove 300.

The anodic oxide film 50 of the present invention is formed by anodizing a metallic base material. If the metallic base material is anodized, there is formed an anodic oxide film 50 which includes a porous layer having a plurality of pores opened on the surface thereof and a barrier layer existing under the porous layer. In this regard, the metallic base material may be aluminum (Al), titanium (Ti), tungsten (W), zinc (Zn) or the like. It is preferred that the metallic base material is made of an aluminum material or an aluminum alloy material which is lightweight, easy to process, superior in heat conductivity and less susceptible to contamination of heavy metal.

For example, by anodizing a surface of an aluminum material, it is possible to form an aluminum oxide film which includes a porous aluminum oxide layer having a plurality of pores 110 opened on the surface thereof and a barrier layer existing under the porous aluminum oxide layer. In the preferred embodiment of the present invention, the anodic oxide film 50 may be formed of only an aluminum oxide film from which aluminum is removed. Electrodes may be formed on the porous aluminum oxide layer of the aluminum oxide film. Alternatively, electrodes may be formed on the barrier layer. The barrier layer of the aluminum oxide film may be removed so that the aluminum oxide film is formed of only the porous aluminum oxide layer having the anodizing pores 110 vertically extending through the porous aluminum oxide layer.

Hereinafter, descriptions will be made on the basis of the anodic oxide film 50 from which the aluminum and the barrier layer are removed.

If the aluminum and the barrier layer are removed from the anodic oxide film 50, the anodizing pores 110 of the anodic oxide film 50 vertically extend through the anodic oxide film 50. Since the anodic oxide film 50 is formed of the porous aluminum oxide layer, the unit anodic oxide film structure 150 has small heat capacity.

Hereinafter, the anodic oxide film structure cutting method will be described in detail with respect to FIGS. 3 to 5.

Figure 3:
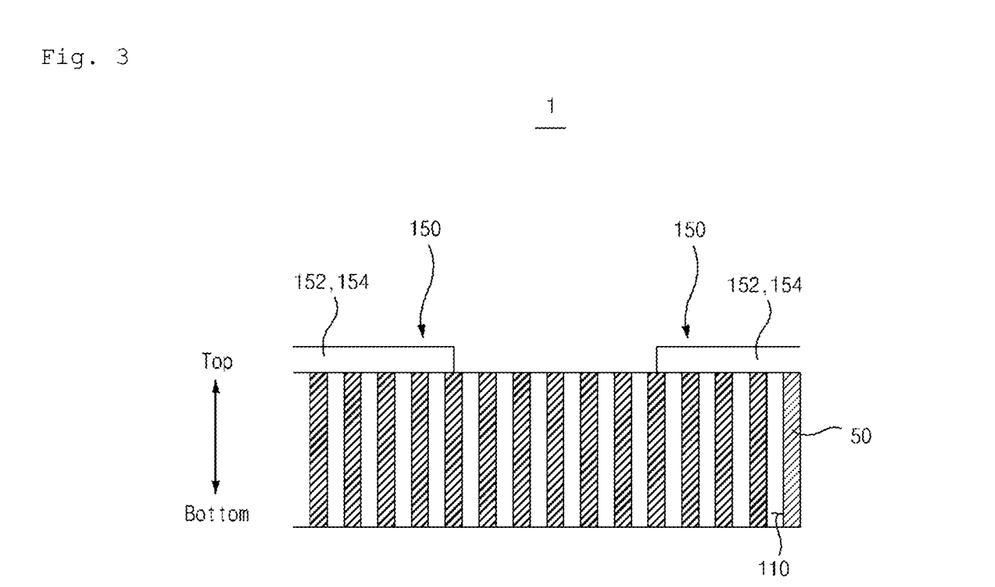
FIG. 3 is an enlarged front view illustrating a portion between unit anodic oxide film structures adjoining each other.

FIG. 3 is an enlarged front view illustrating a portion between the adjoining unit anodic oxide film structures 150 which is not yet cut.

Figure 4:
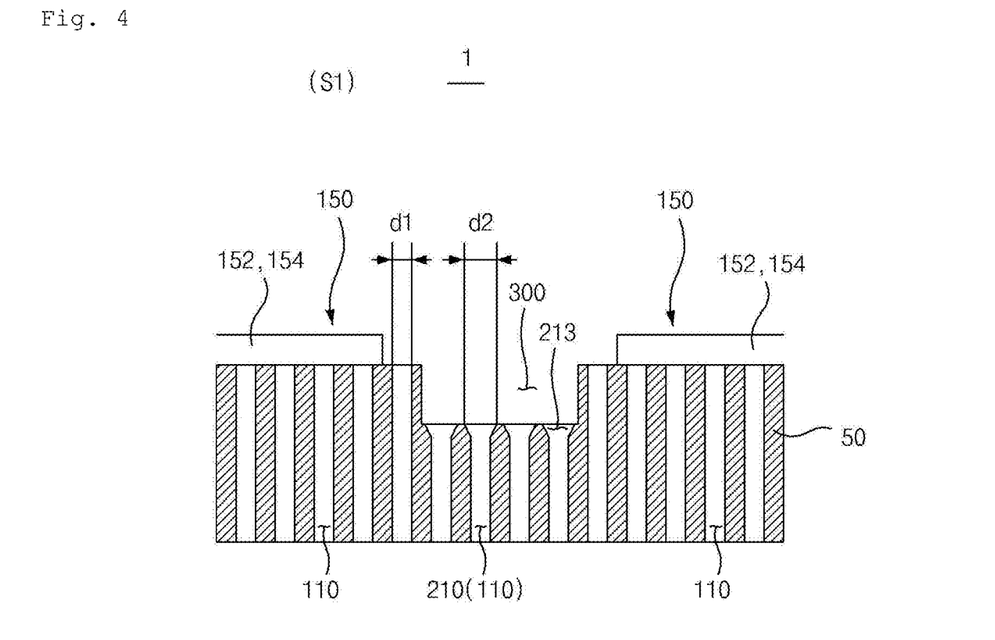
FIG. 4 is a front view illustrating a state in which an etched groove is formed in a portion between unit anodic oxide film structures adjoining each other.
Figure 5:
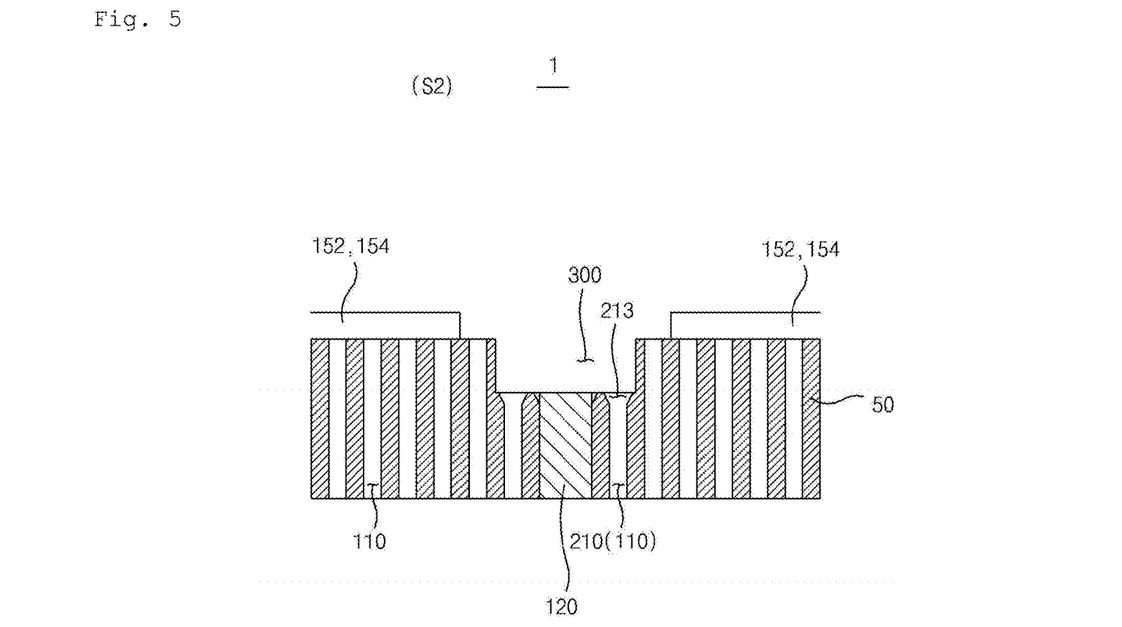
FIG. 5 is a front view illustrating a cut portion between the unit anodic oxide film structures illustrated in FIG. 4.

First of all, at the etching step (S1), as illustrated in FIG. 4, an etched groove 300 is formed by etching the upper surface of the anodic oxide film 50 along a predetermined cutting line 120. The etched groove 300 is formed between one of the adjoining unit anodic oxide film structures 150 and the other.

Figure 9:
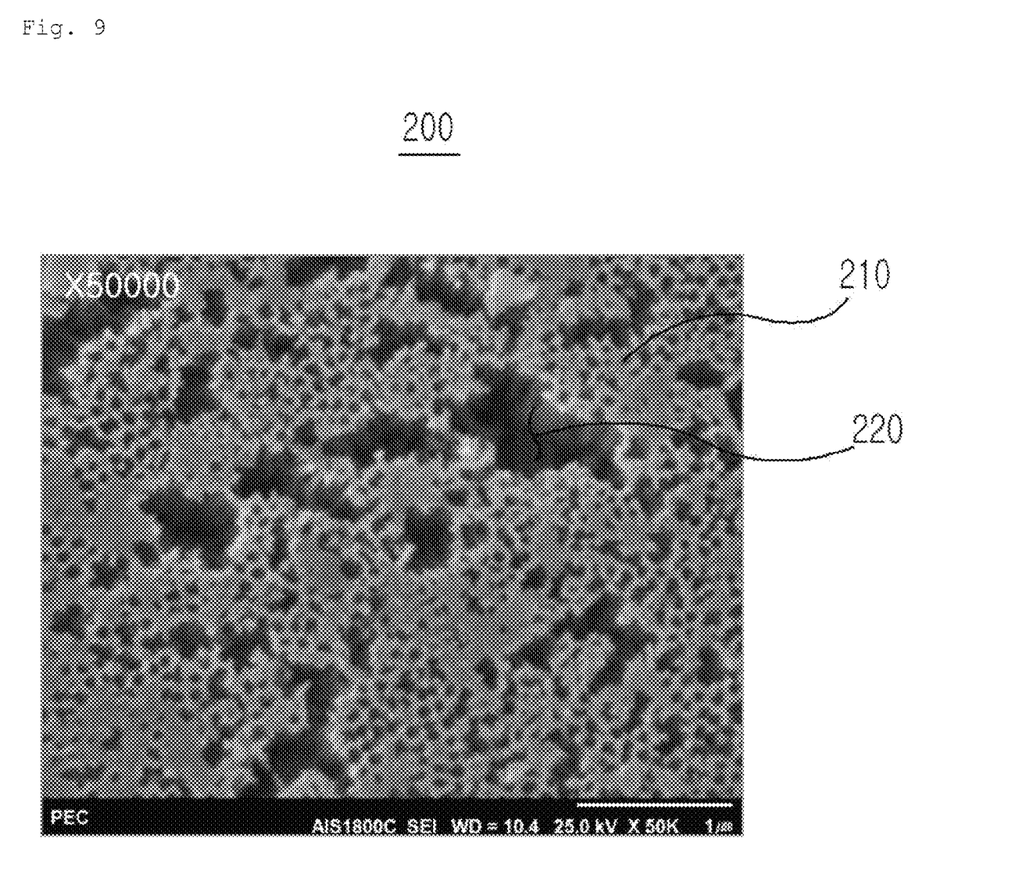
FIG. 9 is an enlarged photograph illustrating an upper surface of a step portion.

When forming the etched groove 300 on the upper surface of the anodic oxide film 50, increased-diameter pores 210 are formed by enlarging entrances 213 of the anodizing pores 110 positioned on an inner bottom surface of the etched groove 300. The diameter d2 of the entrances 213 of the increased-diameter pores 210 positioned on the inner bottom surface of the etched groove 300 is larger than the diameter d1 of entrances of the anodizing pores 110 positioned in a portion other than the inner bottom surface of the etched groove 300 on the upper surface of the anodic oxide film 50 (d1<D2). Furthermore, as illustrated in FIG. 9, the entrances 213 of at least some of the increased-diameter pores 210 are connected to each other, thereby forming a space 220.

The anodic oxide film structure 1 subjected to the etching step (S1) is moved from an etching die to a dicing die where the cutting step (S2) is performed. At the cutting step (S2), the anodic oxide film 50 is vertically cut along the etched groove 300. As illustrated in FIG. 5, the transverse width of a cut portion 120 is smaller than the transverse width of the etched groove 300.

At the cutting step (S2), the anodic oxide film 50 may be cut by a dicing blade. In other words, the anodic oxide film 50 is cut using a dicing blade having a thickness smaller than the transverse width of the etched groove 300. As a result, the anodic oxide film structure 1 illustrated in FIG. 1 is separated into individual unit anodic oxide film structures 150 as illustrated in FIG. 6.

Alternatively, at the cutting step (S2), the anodic oxide film structure 1 may be separated into a plurality of unit anodic oxide film structures 150 by pressing and breaking a lower surface of the anodic oxide film 50. In this case, a pressure is applied upward to the portion of the lower surface of the anodic oxide film 50, which adjoins the etched groove 300, thereby breaking the anodic oxide film 50 along the etched groove 300.

If the anodic oxide film structure 1 is cut according to the cutting method described above, the anodic oxide film 50 receives a reduced tensile force. Thus, a small number of cracks are generated and a yield rate is improved. Accordingly, the anodic oxide film structure 1 can be effectively utilized even when there is required a dicing process.

Figure 6:
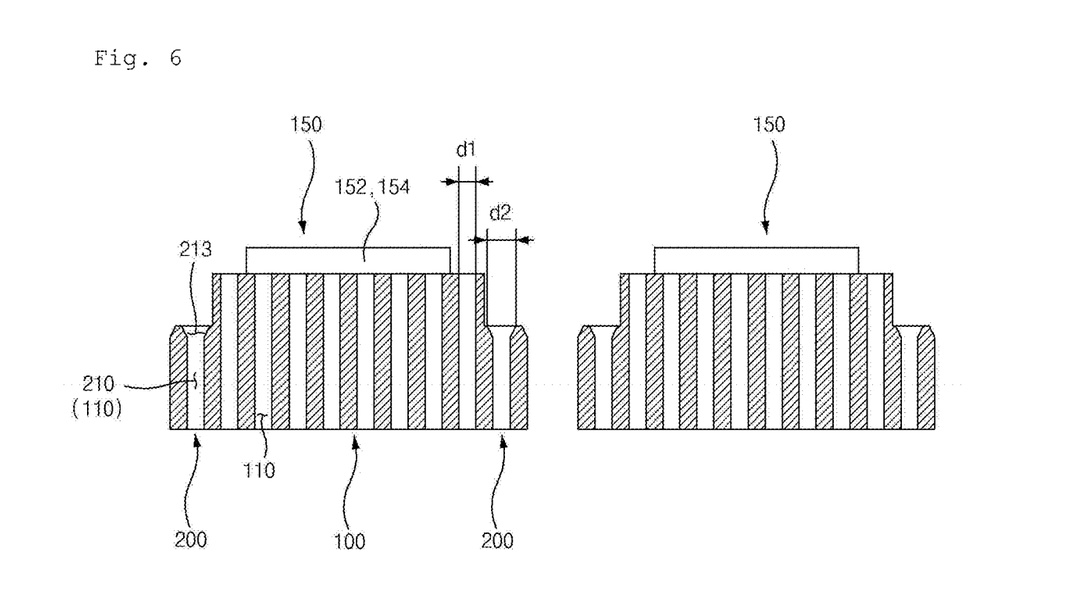
FIG. 6 is a view illustrating the unit anodic oxide film structures cut by an anodic oxide film structure cutting method.
Figure 7:
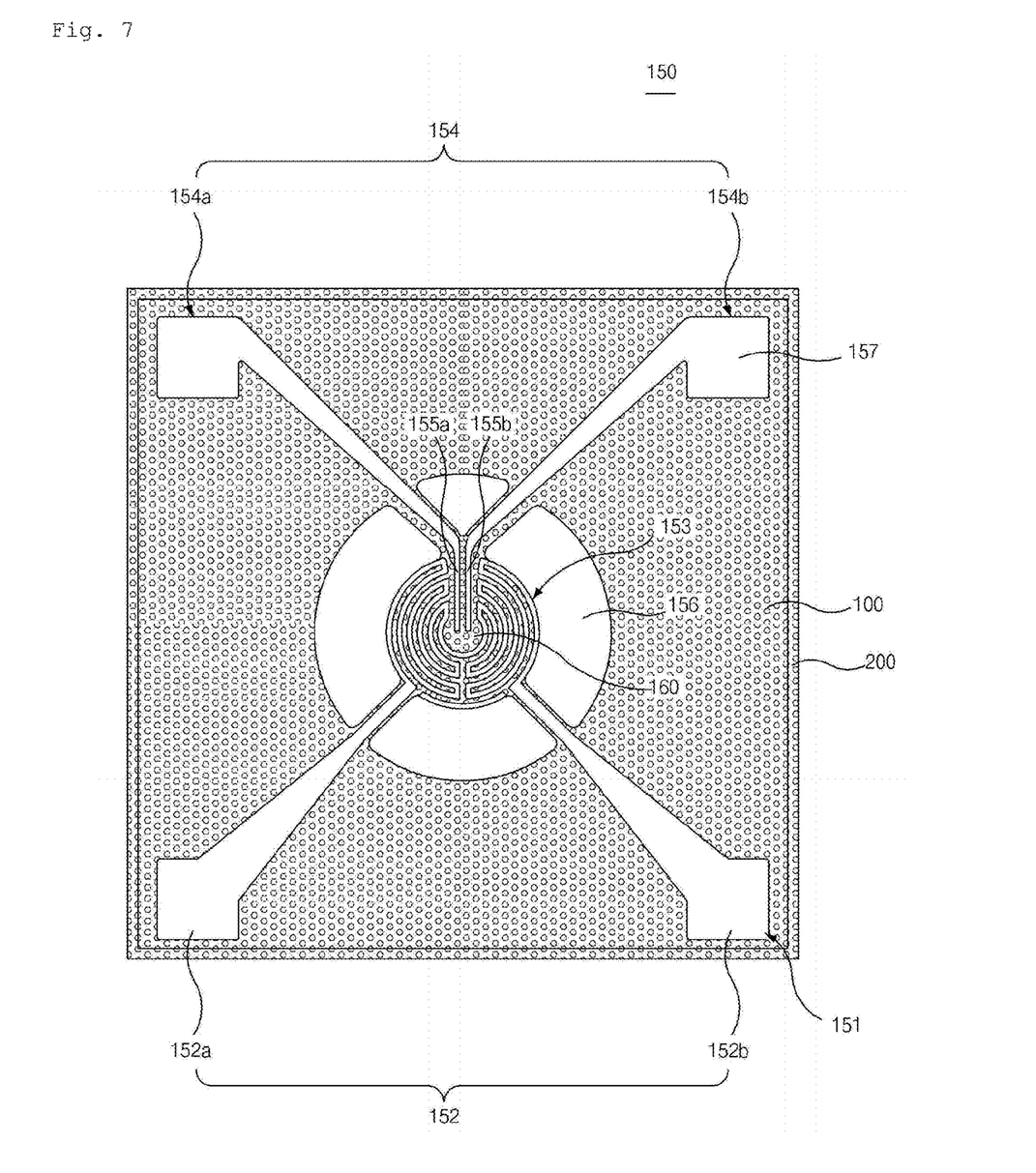
FIG. 7 is a plane view of a unit anodic oxide film structure.

If the anodic oxide film structure 1 illustrated in FIG. 2 is cut by the aforementioned cutting method, there are formed individual unit anodic oxide film structures 150 as illustrated in FIGS. 6 and 7. In the present embodiment, the unit anodic oxide film structures 150 thus cut may be micro sensors 150. Each of the unit anodic oxide film structures 150 includes a body portion 100 as a substrate and electrodes formed on an upper surface of the body portion 100.

In the unit anodic oxide film structures 150 illustrated in FIGS. 6 and 7, a plurality of anodizing pores 110 is formed to vertically extend through the unit anodic oxide film structures 150. Each of the unit anodic oxide film structures 150 includes a body portion 100 and a step portion 200 having a step difference with respect to an upper surface of the body portion 100 and extending outward.

The body portion 100 is formed in a rectangular parallelepiped shape. The electrodes are formed on the upper surface of the body portion 100. The electrodes may be one or both of heater electrodes 151 and sensor electrodes 154.

In the present embodiment, the electrodes are heater electrodes 151 and sensor electrodes 154.

The step portion 200 is formed so as to surround the periphery of the body portion 100. The upper surface of the step portion 200 is positioned lower than the upper surface of the body portion 100.

Figure 8:
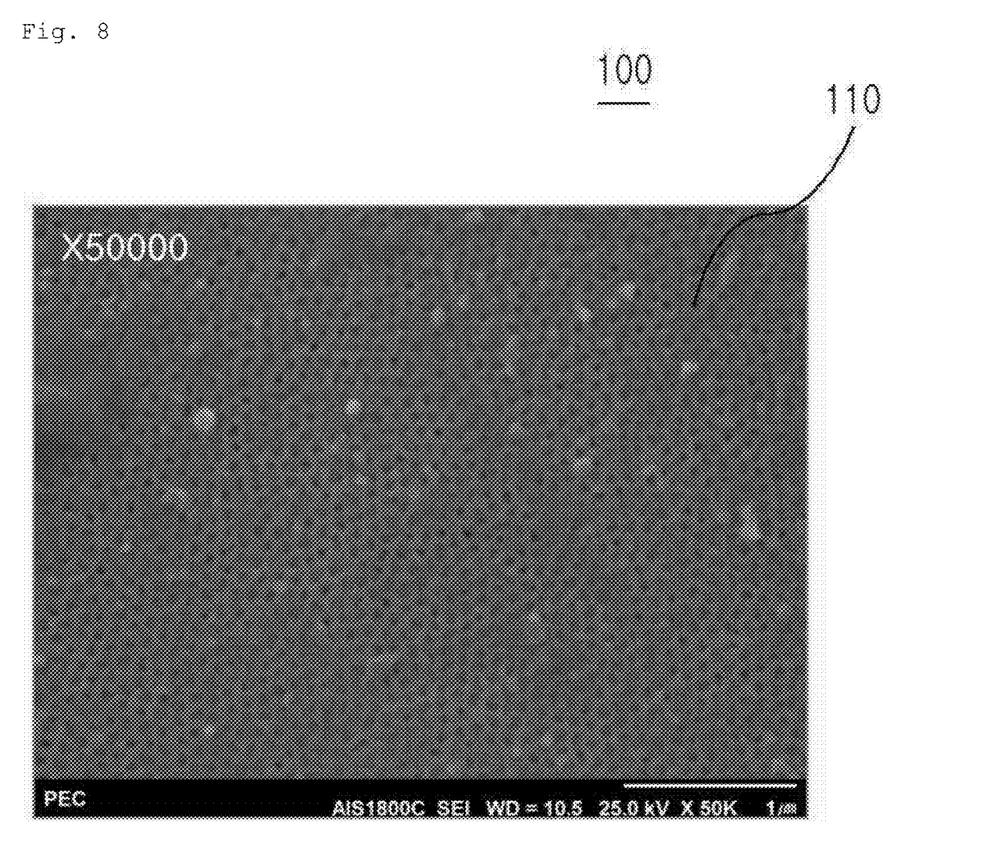
FIG. 8 is an enlarged photograph illustrating an upper surface of a body portion.

In the body portion 100 and the step portion 200, a plurality of anodizing pores 110 is formed so as to vertically extend through the body portion 100 and the step portion 200. The anodizing pores 110 formed in the step portion 200 are increased-diameter pores 210 whose upper entrances 213 have an increased diameter. Thus, as illustrated in FIGS. 8 and 9, the diameter d2 of the entrances 213 of the increased-diameter pores 210 formed on the upper surface of the step portion 200 is larger than the diameter D1 of the entrances of the anodizing pores 110 formed on the upper surface of the body portion 100 (d1<d2). Furthermore, as illustrated in FIG. 9, the entrances 213 of at least some of the increased-diameter pores 210 are connected to each other, thereby forming a space 220. The space 220 is a groove depressed downward with respect to the upper surface of the step portion 200.

As described above, due to the formation of the increased-diameter pores 210 whose entrances 213 have an increased diameter and the formation of the space 220, each of the unit anodic oxide film structures 150 has an ability to relieve external stresses acting in a lateral direction. Thus, the unit anodic oxide film structures 150 are superior in structural stability.

Next, the heater electrodes 151 and the sensor electrodes 154 formed on the upper surface of the body portion 100 will be described with reference to FIG. 7.

The sensor electrodes 154 are configured to sense a change in electrical property when a gas is adsorbed to a sensing material. The sensor electrodes 154 include a first sensor electrode 154a and a second sensor electrode 154b disposed in a spaced-apart relationship with the first sensor electrode 154a. The first sensor electrode 154a and the second sensor electrode 154b are spaced apart in a left-right direction and are symmetrically formed about a center axis vertically extending on a plane.

Each of the first and second sensor electrodes 154a and 154b includes a sensor wiring line 155a or 155b formed in the central region of the upper surface of the body portion 100 and a sensor electrode pad 157 connected to the sensor wiring line 155a or 155b.

The first sensor electrode 154a includes a first sensor wiring line 155a formed in the central region of the upper surface of the body portion 100 and a first sensor electrode pad connected to the first sensor wiring line 155a. The second sensor electrode 154b includes a second sensor wiring line 155b formed in the central region of the upper surface of the body portion 100 and a second sensor electrode pad connected to the second sensor wiring line 155b. The sensor wiring lines 155a and 155b include a first sensor wiring line 155a and a second sensor wiring line 155b. The sensor electrode pads 157 include a first sensor electrode pad and a second sensor electrode pad. The sensor wiring lines 155a and 155b are formed to have a constant width. The sensor electrode pads 157 are formed to have a width larger than the width of the first sensor wiring line 155a and the second sensor electrode 154b. The sensor electrode pads 157 of the first and second sensor electrodes 154a and 154b are respectively disposed in two adjoining corners of the body portion 100 formed in a rectangular shape. The sensor electrode pads 157 are formed so that the width thereof becomes larger toward the end portions thereof. In other words, the sensor electrode pads 157 are formed so that the width thereof becomes smaller toward the first sensor wiring line 155*a* and the second sensor wiring line 155*b*.

The sensor electrodes 154 are made of one of platinum (Pt), tungsten (W), cobalt (Co), nickel (Ni), gold (Au) and copper (Cu), or alloy thereof.

The heater electrodes 151 are formed on the upper surface of the body portion 100.

In the case where the electrodes are formed on the porous aluminum oxide layer of the aluminum oxide film, the upper and lower portions of the anodizing pores 110 positioned under the heater electrodes 151 and the sensor electrodes 154 are closed by the heater electrodes 151 and the sensor electrodes 154. In the case where the electrodes are formed on the barrier layer of the aluminum oxide film, the upper portions of the anodizing pores 110 positioned under the heater electrodes 151 and the sensor electrodes 154 are closed and the lower portions of the anodizing pores 110 are opened. In the case where the barrier layer of the aluminum oxide film is removed, the upper portions of the anodizing pores 110 positioned under the heater electrodes 151 and the sensor electrodes 154 are closed by the heater electrodes 151 and the sensor electrodes 154 and the lower portions of the anodizing pores 110 are opened. In this way, the heater electrodes 151 are formed on the porous aluminum oxide layer. Thus, the unit anodic oxide film structures 150 have small heat capacity.

Each of the heater electrodes 151 includes a heat generation wiring line 153 formed in the central region of the upper surface of the body portion 100 so that the heat generation wiring line 153 is positioned closer to the sensor wiring lines 155*a* and 155*b* than the sensor electrode pads 157, and heater electrode pads 152 connected to the heat generation wiring line 153.

The heat generation wiring line 153 is formed in the central region of the upper surface of the body portion 100 so as to surround at least a portion of the first sensor wiring line 155*a* and the second sensor wiring line 155*b*. The heater electrode pads 152 includes a first heater electrode pad 152*a* and a second heater electrode pad 152*b*, which are respectively connected to the opposite ends of the heat generation wiring line 153 and are spaced apart from each other. The heat generation wiring line 153 is disposed in the central region of the upper surface of the body portion 100.

When viewed on a plane illustrated in FIG. 7, the heat generation wiring line 153 is formed in a symmetrical relationship with respect to a line passing through the center of the upper surface of the body portion 100. The heat generation wiring line 153 includes a plurality of arc portions formed in an arc shape and a plurality of connection portions configured to interconnect the arc portions.

The heat generation wiring line 153 is formed by repeatedly connecting the arc portions and the connection portions. For example, a first arc portion is formed in an arc shape adjacent to an air gap 156. A first connection portion extends from one end of the first arc portion toward the center of the upper surface of the body portion 100. A second arc portion extends in an arc shape from one end of the first connection portion and is disposed at the inner side of the first arc portion in a spaced-apart relationship. A second connection portion is formed to extend from one end of the second arc portion toward the center of the upper surface of the body portion 100.

The heat generation wiring line 153 is formed into one piece by interconnecting the first to third arc portions and is symmetrical with respect to a line passing through the center of the upper surface of the body portion 100.

As illustrated in FIG. 7, the respective arc portions of the heat generation wiring line 153 are formed in a substantially semi-circular arc shape and are symmetrically formed in a left-right direction. The heat generation wiring line 153 has a circular shape as a whole. This makes it possible to improve the temperature uniformity in the central region of the upper surface of the body portion 100.

The center of the heat generation wiring line 153 is a point where the arc portions disposed at the left and right side meet with each other. Two arc portions having an arc shape are combined with each other to form a circle opened at the upper side. An isolation space portion 160 is formed inside the heat generation wiring line 153. The isolation space portion 160 is formed to extend from the central region of the heat generation wiring line 153 to the upper portion of the heat generation wiring line 153. In other words, the heat generation wiring line 153 is divided into a left part and a right part so that the isolation space portion 160 extends from the upper portion of the heat generation wiring line 153 to the central region thereof. The sensor wiring lines 155*a* and 155*b* are disposed in the isolation space portion 160. That is to say, the heat generation wiring line 153 is formed so as to surround at least a portion of the first and second sensor wiring lines 155*a* and 155*b*. The second heater electrode pad 152*b* is connected to the other end of the first arc portion. The first heater electrode pad 152*a* is connected to one end of the third arc portion.

The heater electrodes 151 are made of one of platinum (Pt), tungsten (W), cobalt (Co), nickel (Ni), gold (Au) and copper (Cu), or alloy thereof.

The heater electrode pads 152 include first and second heater electrode pads 152*a* and 152*b* respectively connected to the opposite ends of the heat generation wiring line 153. In this way, at least two heater electrode pads 152 are formed. The heater electrode pads 152 are disposed in two remaining corners of the upper surface of the body portion 100 and are formed so that the width thereof grows larger outward. In other words, the heater electrode pads 152 are formed so that the width thereof grows smaller toward the heat generation wiring line 153. The heater electrode pads 152 are formed so as to have a width larger than the width of the heat generation wiring line 153.

The air gap 156 is disposed around the heat generation wiring line 153 and the sensor wiring lines 155*a* and 155*b*. In the present embodiment, four air gaps 156 are formed in an arc shape. The air gaps 156 are spaced apart in a circumferential direction. That is to say, the air gaps 156 are discontinuously formed in a plural number. The air gaps 156 are formed to vertically extend through the body portion 100. That is to say, the air gaps 156 are spaces formed to extend from the upper surface of the body portion 100 to the lower surface thereof.

A sensing material, which covers the heat generation wiring line 153 and the sensor wiring lines 155*a* and 155*b*, is coated on the central region of the upper surface of the body portion 100. The sensing material is coated by printing. If the sensing material is coated by printing in this way, a mesh-shaped mark is left on the surface of the sensing material after the sensing material is coated.

While preferred embodiments of the present invention have been described above, the present invention is not limited to the aforementioned embodiments. It goes without saying that a person skilled in the relevant art can make various changes and modifications without departing from the spirit and scope of the invention defined in the claims.

What is claimed is:

1. A unit anodic oxide film structure, comprising:
a body portion having a plurality of anodizing pores formed vertically therein;
a step portion having a step difference formed so as to surround the periphery of said body portion, wherein an upper surface of said step portion is positioned lower than an upper surface of said body portion;
electrodes formed on said upper surface of said body portion; and
a plurality of increased-diameter pores formed on said upper surface of said step portion, the diameter of entrances of the increased-diameter pores is larger than the diameter of entrances of the anodizing pores formed on said upper surface of said body portion, and at least some of said entrances of said increased-diameter pores formed on said upper surface of said step portion being connected to each other to form a space, wherein the increased-diameter pores and the space serve to relieve external stresses acting in a lateral direction.

* * * * *